(12) United States Patent
Kimball et al.

(10) Patent No.: US 6,792,252 B2
(45) Date of Patent: Sep. 14, 2004

(54) WIDEBAND ERROR AMPLIFIER

(75) Inventors: Donald Felt Kimball, San Diego, CA (US); Joseph L. Archambault, San Diego, CA (US); Walter Haley, Escondido, CA (US); Lennart Mathe, San Diego, CA (US)

(73) Assignee: Telefonaktiebolaget LM Ericsson (Publ) (SE)

( * ) Notice: Subject to any disclaimer, the term of this patent is extended or adjusted under 35 U.S.C. 154(b) by 435 days.

(21) Appl. No.: 10/068,348

(22) Filed: Feb. 6, 2002

(65) Prior Publication Data

US 2003/0148792 A1 Aug. 7, 2003

(51) Int. Cl.[7] ................................................. H04B 1/04
(52) U.S. Cl. ..................................... 455/127.3; 330/251
(58) Field of Search .......................... 455/127.1, 127.2, 455/127.3, 114.3; 330/251, 207 A

(56) References Cited

U.S. PATENT DOCUMENTS 6,252,784 B1    6/2001   Dobrenko
6,300,826 B1   10/2001   Mathe et al.
6,476,674 B2 * 11/2002   Smedegaard-Pedersen et al. ........................ 330/251

* cited by examiner

Primary Examiner—Lee Nguyen
Assistant Examiner—Sanh Phu
(74) Attorney, Agent, or Firm—Coats & Bennett, PLLC

(57) ABSTRACT

An error amplifier circuit reduces distortion in an amplified signal by reflecting a feedback signal into the amplified signal using an output transformer. A first amplifier generates a reference signal corresponding to the input signal from which the amplifier output signal is derived. This reference signal represents the desired waveform for the amplified signal. An error sense element generates an error signal based on the difference between the reference and amplified signals. The error sense element preferably imparts high common-mode rejection to the error signal. A second amplifier generates the feedback signal based on amplifying the error signal, and an output transformer generates a compensated amplified signal by coupling the feedback signal into the amplified signal. The output transformer increases the reflected load impedance seen by the error amplifier, thus relieving it from driving the feedback signal into the potentially low load impedance driven by the compensated amplified signal.

44 Claims, 4 Drawing Sheets

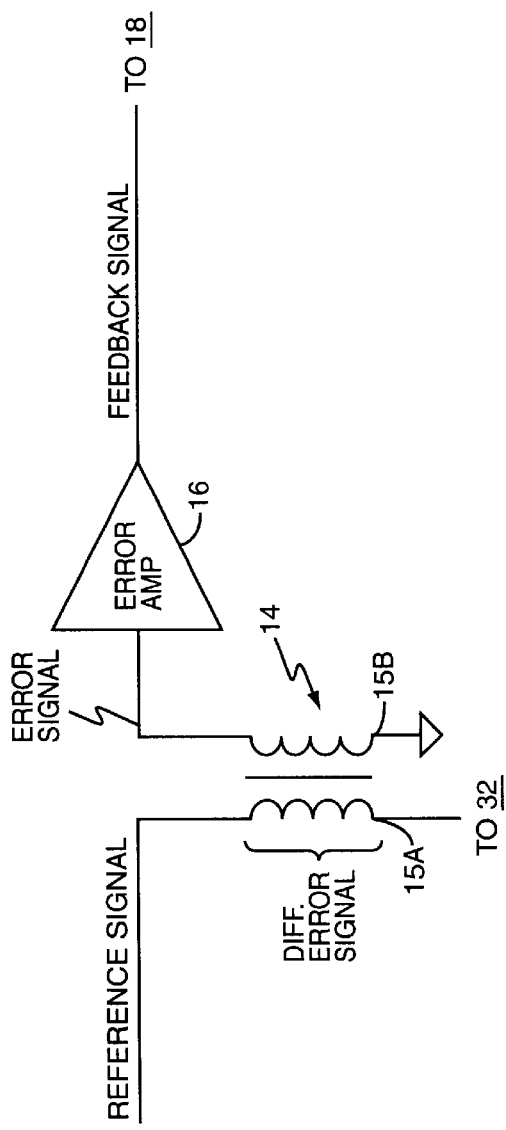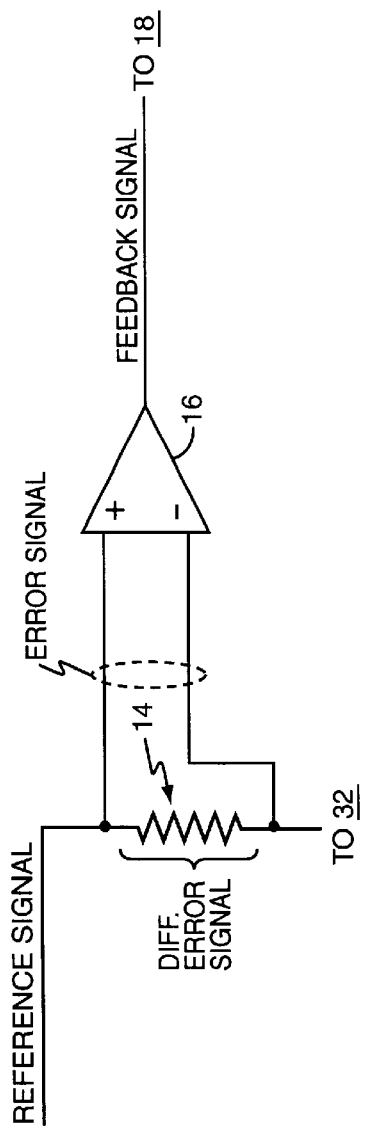
*FIG. 2A*
*FIG. 2B*

WIDEBAND ERROR AMPLIFIER

RELATED APPLICATIONS

This application claims priority under 35 U.S.C. § 120 from the co-pending application Ser. No. 09/911,105, entitled "Apparatus and Method for Efficiently Amplifying Wideband Envelope Signals," filed on Jul. 23, 2001, and which is a continuation of the now-issued and identically titled U.S. Pat. No. 6,300,826 B1, from which priority also is claimed.

BACKGROUND OF THE INVENTION

The present invention generally applies to signal amplification, and particularly applies to reducing distortion using an error amplifier.

Ideal linear signal amplification involves the creation of an output signal that faithfully reproduces the characteristics of an input signal but with greater signal amplitude or power. While high fidelity amplification techniques exist, achieving linear low-distortion signal amplification is challenging, particularly with regard to certain types of signals, and in certain types of environments. For example, radio frequency transceivers, such as those used in modern cellular telephones and those used in the supporting radio base stations must generate digitally modulated waveforms with high linearity to achieve high data rates and avoid adjacent channel interference.

Reducing distortion in an amplified output signal poses a number of technical challenges. For example, in the context of radio frequency amplification, the signals of interest are relatively wideband. In amplifier systems based on the Wideband Code Division Multiple Access (W-CDMA) standards, for example, the signal to be amplified having meaningful content may have a frequency of 5 MHz or more. Where multiple-carrier signals are generated, the frequencies of interest may easily extend into the 15 MHz range. Additionally, the use of pre-distortion in such systems easily doubles the bandwidth requirements.

Sources of distortion in the output signal include linear and non-linear distortions. Examples of such distortions include, but are not limited to, signal gain non-linearity, transport/group delay differences in the amplifier circuit at different frequencies, cross-over distortion in the amplifier output circuits, etc.

Any circuit for reducing distortion in an amplifier output signal must generate relatively high fidelity error correction signals across the full bandwidth of interest, and itself must not add to the distortion of the output signal. What is needed then is a distortion reduction circuit that generates accurate distortion compensation signals across a preferably wide frequency spectrum, and that is practically suitable for inclusion in radio frequency transmitter circuits.

BRIEF SUMMARY OF THE INVENTION

The present invention provides methods and apparatus for reducing the distortion in an amplified signal generated by a primary amplifier, by coupling an error-driven feedback signal into the amplified signal via an output transformer. Combining the feedback signal with the amplified signal generates a compensated amplified signal having reduced levels of distortion. A reference amplifier circuit generates a reference signal corresponding to the input signal provided to the primary amplifier for amplification, and this reference signal drives a sense element differentially relative to the compensated amplified signal. Driven in this manner, the sense element generates an error signal, preferably having high common mode rejection and high frequency fidelity. In turn, an error amplifier generates the feedback signal by amplifying the error signal from the error sense element.

In an exemplary embodiment, the error sense element comprises an error sense transformer that comprises a first winding coupling the output of the reference amplifier to the output of a first winding of the output transformer. The other end of the output transformer's first winding is coupled to the output of the primary amplifier. Thus, a differential error signal appears across the first winding of the error sense transformer based on differences between the reference signal and the compensated amplified signal. A second winding of the error sense transformer couples the error signal into an input of the error amplifier, which generates the feedback signal responsive to this input error signal. The feedback signal is applied to a second winding of the output transformer such that it is combined with the amplified signal from the primary amplifier, thus forming the compensated amplified signal. Use of the error sense transformer provides high common mode rejection, which helps insure that the error signal substantially reflects only the differences between the reference signal and the compensated amplified signal.

Alternatively, the error sense element might be implemented as a resistor coupling the reference signal to the compensated amplified signal. With this configuration, a differential error voltage is developed across the resistor based on differences between the reference and compensated amplified signals. A differential connection between the error amplifier and the resistor allows the error amplifier to generate the feedback signal based on the differential error voltage. While the resistor-based approach to error sensing might result in lower common mode rejection and lower frequency fidelity as compared to using the error sense transformer discussed above, it does yield potential cost savings where potentially lower compensation performance is tolerable.

Regardless of the particular implementation of the error sense element, use of transformer coupling between the feedback and amplified signals imparts several advantages to exemplary embodiments of the error amplifier circuit. Such advantages include, but are not limited to reduced loading of the error amplifier, and convenient scaling of the feedback signal relative to the amplified signal. Relieving the error amplifier from driving the output load as seen by the compensated amplified signal provides, among other things, component selection flexibility. That is, because the output transformer multiplies the load impedance by the square of a desired turns ratio, the error amplifier is not required to have the same drive capability as the primary amplifier. Further, maintaining signal fidelity in the error signal is easier with a more lightly loaded error amplifier.

An exemplary embodiment of the present invention finds particular use in envelope elimination and restoration (EER) circuits as exemplified in the co-pending application Ser. No. 09/911,105, entitled "Apparatus and Method for Efficiently Amplifying Wideband Envelope Signals," filed on Jul. 23, 2001, and which is a continuation of the now-issued and identically titled U.S. Pat. No. 6,300,826 B1, both of which are incorporated in their entireties herein by reference. However, those skilled in the art will recognize that various embodiments of the present invention have applicability well beyond this exemplary application.

BRIEF DESCRIPTION OF THE DRAWINGS

FIGS. 2A and 2B illustrate exemplary embodiments of the error sense element and error amplifier of FIG. 1.

DETAILED DESCRIPTION OF THE INVENTION

Figure 1:
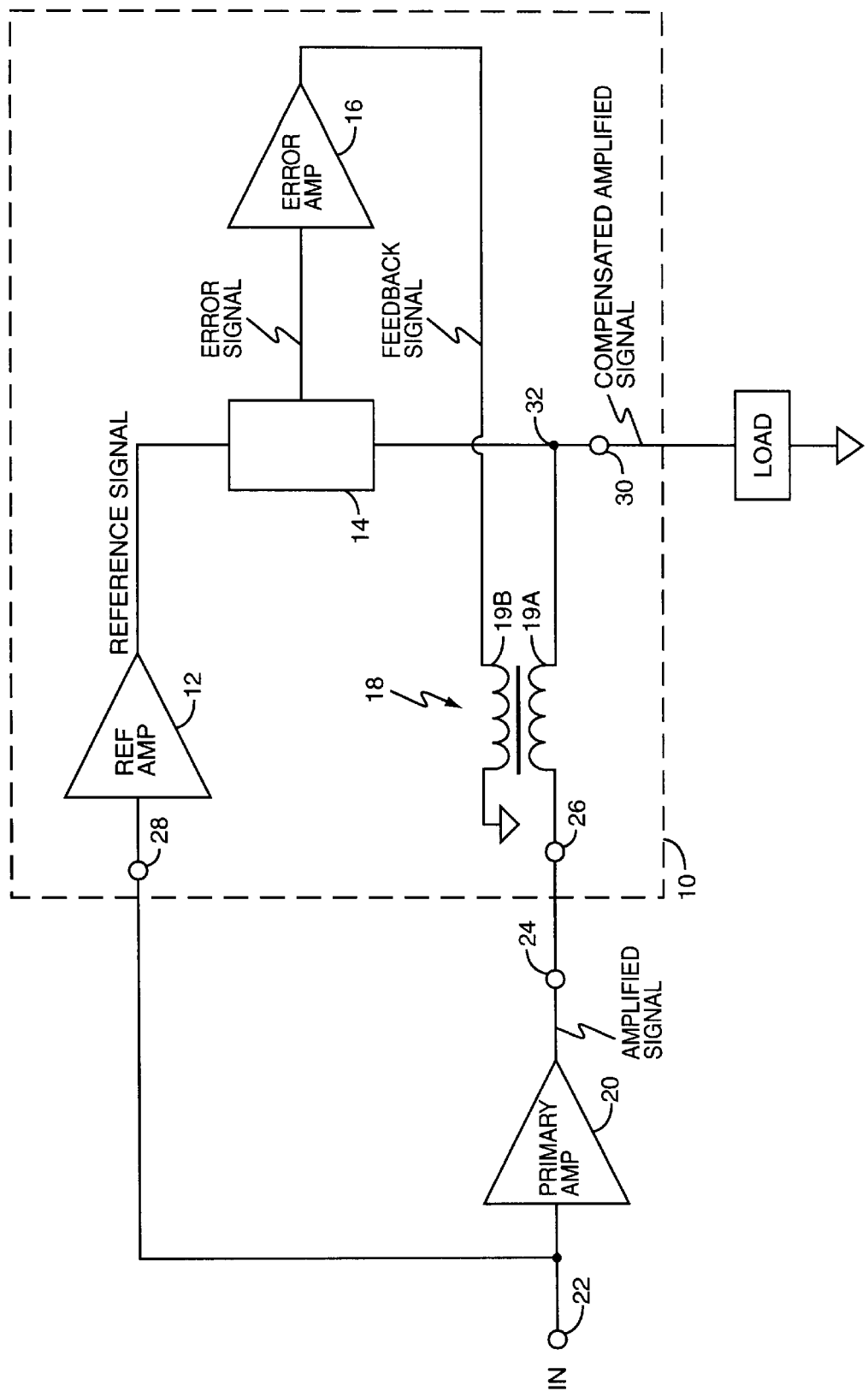
FIG. 1 is a diagram of an exemplary error amplifier circuit in accordance with the present invention.

FIG. 1 illustrates an exemplary error amplifier circuit in accordance with the present invention. The error amplifier circuit 10 comprises a reference amplifier 12, an error sense element 14, an error amplifier 16, and an output transformer 18. It should be noted that the terms "reference amplifier" and "error amplifier" do not necessarily connote a specific amplifier type, or even amplifier topology, but rather serve as contextual terms alluding to the functionality of these elements.

In operation, the circuit 10 reduces distortion in the output signal, referred to as the amplified signal, of a primary amplifier 20. As detailed below, the circuit 10 may be configured for wideband operation, thereby allowing it to compensate for signal distortion in the amplified signal across a wide range of frequencies. In this context, the circuit 10 finds exemplary use in reducing distortion in the amplified signals generated by radio frequency (RF) amplifiers.

The primary amplifier 20, not part of circuit 10 in this embodiment, receives an input signal to be amplified on its input terminal 22, and provides the amplified signal to be compensated on its output terminal 24. The primary amplifier 20 thus provides the amplified signal principally responsible for driving the load.

Ideally, the amplified signal generated by the primary amplifier 20 perfectly corresponds to the input signal waveform, possibly scaled by a desired signal gain. Non-linearity in the primary amplifier 20 prevents a perfectly linear correspondence between input and output waveforms by introducing distortion in the amplified signal. For example, frequency-sensitive amplifier gain causes non-uniform attenuation or peaking in the amplified signal at certain frequencies. Slew-rate limitations of the primary amplifier 20 also distort the amplified signal in some instances. In general, there exist a host of practical circuit realities that introduce distortion in the amplified signal, as is well understood by those skilled in the art.

As noted above, circuit 10 reduces distortion in the amplified signal generated by the primary amplifier 20. Circuit 10 receives the amplified signal on an input terminal 26, and receives the input signal from which the amplified signal is derived by the primary amplifier 20 on a second input terminal 28. Using these two input signals, circuit 10 provides a reduced-distortion version of the amplified output signal on its output terminal 30, which signal is referred to herein as the "compensated amplified signal."

The compensated amplified signal is formed by reflecting a distortion-compensating feedback signal into the amplified signal from the primary amplifier 20 with a desired gain using output transformer 18. The output transformer 18 comprises a first winding 19A that couples input terminal 26 to a summing node 32, which node is connected to output terminal 30. Thus, winding 19A carries the amplified signal from the primary amplifier 20, and must be suitable for carrying the required load current. A second winding 19B couples the output of the error amplifier 16 to a signal ground, and thus carries the feedback signal generated by error amplifier 16.

Mutual inductance between windings 19A and 19B couple the feedback signal into the amplified signal, and the turns ratio between windings 19A and 19B is chosen to increase the reflected load impedance seen by the error amplifier 16, thereby reducing output loading on it. The turns ratio winding 19B to 19A of the error sense transformer typically falls into the range of from 4:1 to 16:1. For example, a 10:1 turns ratio between windings 19B and 19A increases the reflected load impedance by a factor of 100, which is particularly helpful in radio frequency applications where the load attached to output terminal 30 may be less than one Ohm. This reduction in error amplifier loading increases the range of design choices available for error amplifier 16, and reduces distortion in the feedback signal. That is, isolating the error amplifier 16 from potentially low load impedances generally improves its ability to maintain the fidelity of the feedback signal.

The feedback signal is generated by amplifying an error signal generated by the error sense element 14. The error signal, which serves as an input to the error amplifier 16, is generally proportional to the difference between the compensated amplified signal at summing node 32 and the reference signal generated by the reference amplifier 12. As a general approach, the reference amplifier 12 is configured to amplify the same input signal as the primary amplifier 20, and with the same signal gain. That is, the reference signal serves as a high fidelity, i.e., low distortion, representation of what the compensated amplified signal should look like, and the difference between it and the actual compensated amplified signal represents the error from which the error signal is derived. Ensuring that the output of the reference amplifier 12 is lightly loaded helps insure its operation as a high fidelity amplifier.

Thus, the error sense element 14 ideally generates the error signal but avoids significant loading of the reference amplifier 12. FIG. 2A illustrates an exemplary approach to implementing the error sense element 14. Here, the error sense element 14 comprises an error sensing transformer having windings 15A and 15B. The first winding 15A couples the output of the reference amplifier 12 to the summing node 32. A differential error signal develops across winding 15A because the top of the winding is connected to the reference signal and the bottom of the winding is connected to the compensated amplified signal. Note that this configuration of the error sense element 14 yields high common-mode rejection, which enhances the accuracy of the error signal generated by it. An added benefit of this circuit configuration is that the reference amplifier 12 does not have to provide load current, which eases the challenges associated with generating the reference signal with high signal fidelity.

The differential error signal across winding 15A is reflected into winding 15B, which winding is coupled at one end to the input of the error amplifier 16, and at the other end to a signal ground. This configuration reflects the differential error signal developed across winding 15A to winding 15B, where it is converted into a single-ended error signal driving the error amplifier 16. Thus, the feedback signal generated by the error amplifier 16 is responsive to distortion errors in the compensated amplified signal and serves to reduce such errors.

Setting the turns ratio of winding 15A to winding 15B determines the signal gain of the error sense transformer 14. Typically, the turns ratio of winding 15A to 15B falls into the range from 1:4 to 1:16, with 1:5 representing an exemplary value. In general, the turns ratio is chosen such that error signal is generated with the desired signal gain. Note that the typically high input impedance of the error amplifier input results in a relatively high impedance being presented to the reference amplifier 12 even with the step-up function of transformer coils 15A and 15B.

Additionally, the gain of error amplifier 16 is preferably configured to be greater than ten times the ratio between the turns ratio of the transformer used in the error sense element 14 and the output transformer 18. For example, with the ratio of windings 15A to 15B set to 1:4, and windings 19B to 19A set to 10:1, the gain of error amplifier 16 should be set to 25 or greater. Configuring the gain of the error amplifier 16 in this manner results in a 20 dB or greater error reduction in the compensated amplified signal.

To further enhance the error reduction operation of the error amplifier circuit 10, the overall gain and group delay of the reference amplifier 12 is normally set equal to the overall gain and group delay of the primary amplifier 20. However, gain and delay of reference amplifier 12 may be adjusted to equalize for frequency dependent gain variations or delay variations in the error sense element 14 and the output transformer 18.

Figure 3:
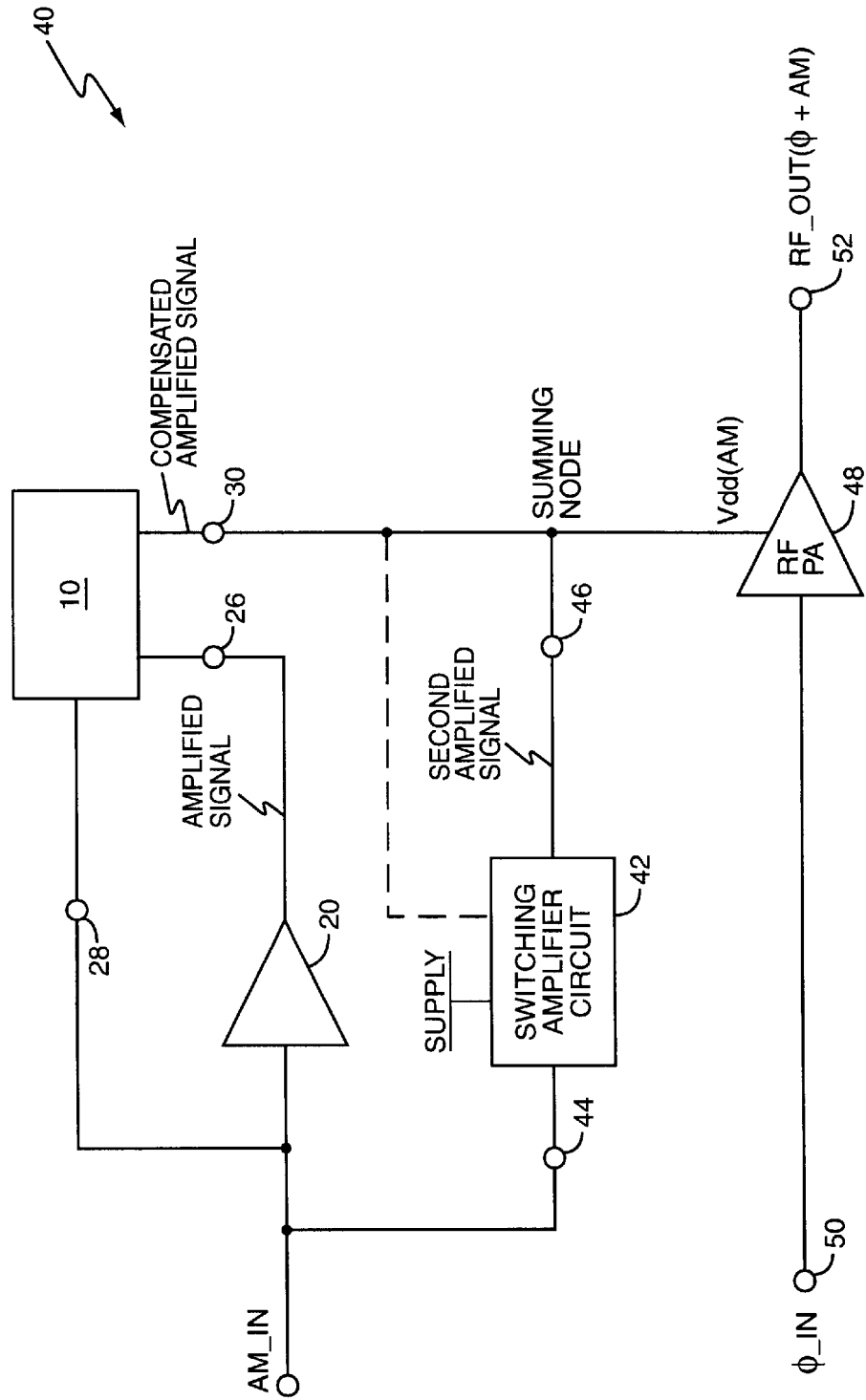
FIG. 3 is a diagram of an envelope elimination and restoration (EER) circuit employing the error amplifier circuit of FIG. 1.

FIG. 3 illustrates an exemplary application of the circuit 10 detailed above. Here, the circuit 10 forms a part of an EER circuit 40. For comprehensive details regarding exemplary EER circuits and their operation, the reader is referred to the earlier incorporated co-pending application Ser. No. 09/911,105 and the related U.S. Pat. No. 6,300,826 B1.

In the simplified illustration of FIG. 3, the EER circuit 40 comprises the circuit 10 and primary amplifier 20 introduced above, and a switching amplifier circuit 42 having an input terminal 44, and an output terminal 46. The EER circuit 40 acts as an amplitude modulated power supply for the radio frequency power amplifier (PA) 48. That is, PA 48 operates as a saturated-mode amplifier receiving a constant envelope phase modulated signal ($\phi\_IN$) on its input terminal 50, and provides a phase-and amplitude-modulated radio frequency (RF) output signal on terminal 52. The amplitude modulation in the RF output signal is imparted by modulating the Vdd supply voltage to the PA 48 using EER circuit 40.

To accomplish this, an amplitude modulation information signal (AM_IN) drives the primary amplifier 20, which produces a responsive amplified signal. The circuit 10 receives this amplified signal on its terminal 26, as well as the original AM_IN signal on its terminal 28. As described above, the circuit 10 reduces distortion in the amplified signal, providing the reduced distortion version of the amplified signal (i.e., the compensated amplified signal) to the load, i.e., the PA 48 attached to its output terminal 30. That is, the primary amplifier 20 produces an amplified signal responsive to desired amplitude modulations, and the circuit 10 generates the compensated amplified signal by reducing distortion in the amplified signal. The compensated amplified signal then, in combination with an output signal from the switching amplifier circuit 42, serves as the amplitude-modulated voltage supply signal for the PA 48.

Switching amplifier circuit 42 provides the bulk of the low frequency amplification of the input signal AM_IN, and therefore provides most of the DC and lower frequency power required by the PA 48. The output of the switching amplifier circuit 42 is as noted, combined with the output from the circuit 10 to form the amplitude-modulated supply voltage (Vdd) provided to the PA 48. This arrangement allows the circuit 10 to compensate the combined supply voltage signal provided by it and the switching amplifier 42. The switching amplifier 42 preferably comprises a switching circuit arrangement of commercially available FETs and an integrated circuit (IC) switching regulator.

In this application, the primary amplifier 20 may be implemented as shown in the incorporated co-pending application Ser. No. 09/911,105 and its parent, U.S. Pat. No. 6,300,826 B1. However, those skilled in the art will recognize that the primary amplifier 20 is subject to much variation. For example, in an alternative exemplary embodiment, primary amplifier 20 is implemented as a wideband, dual feedback amplifier as shown in the co-pending and commonly assigned U.S. patent application entitled "Dual Feedback Linear Amplifier," which was filed on Jan. 23, 2002, and is incorporated herein by reference in its entirety.

Figure 4A:
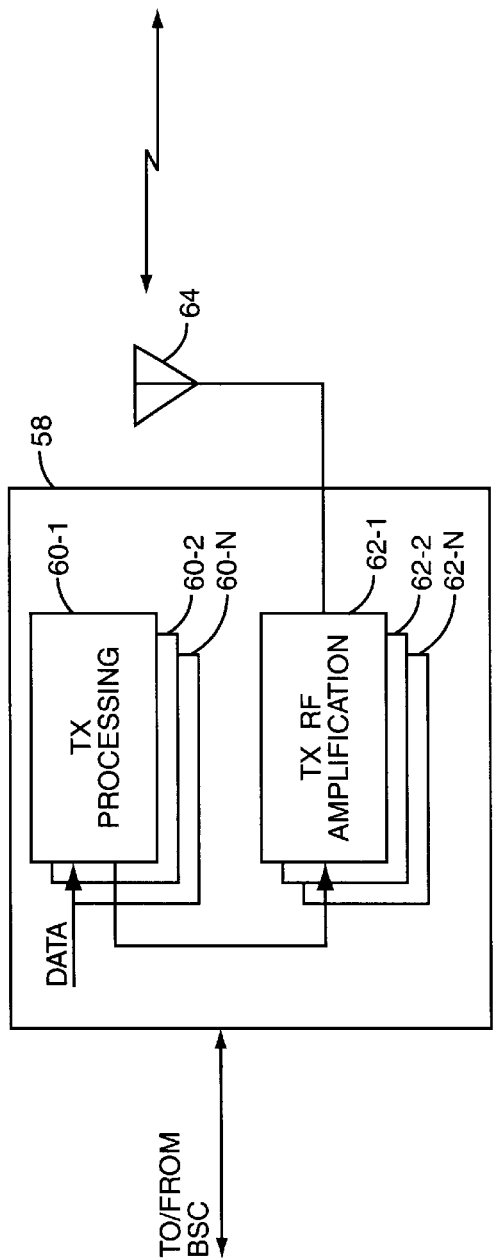
FIGS. 4A and 4B illustrate exemplary details for a radio base station according to the present invention.
Figure 4B:
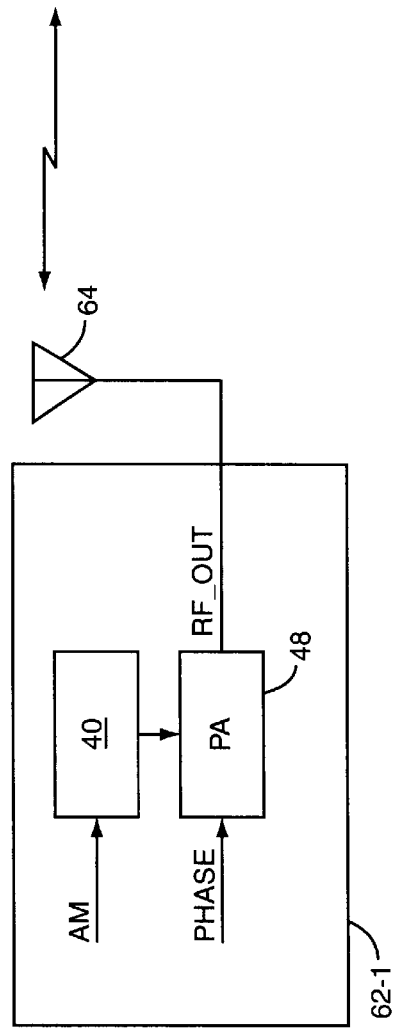

FIGS. 4A and 4B illustrate simplified but exemplary details for a radio base station (RBS) 58 according to the present invention, and which might be used in a wireless communication network. FIG. 4A illustrates that the exemplary RBS 58 comprises transmit processing resources generally referred to by the numeral 60, and radio frequency transmitter resources generally referred to by the numeral 62. These various resources might be segregated into racks or sub-racks, and/or into processing cards within the RBS 58. Thus, transmit processing resources 60-1 through 60-N refer to segregated sets of transmit processing resources. Likewise, RF transmitter resources 62-1 through 62-N refer to segregated sets of RF transmitter resources.

Those skilled in the art will appreciate that the organization of the various resources within the RBS 58 is subject to substantial variation, and that these exemplary details are not limiting with respect to use of the multistage amplifier 10 within the RBS environment. Thus, the illustrated segregation of processing and transmitter resources 60 and 62 is not a necessary arrangement as regards practicing the present invention.

In operation, one or more data signals corresponding to mobile stations (not shown) operating within the radio coverage area of the RBS 58 serve as inputs to the transmit processing resources 60. Transmit processing resources 60 process this data by generally applying symbol and channel encoding schemes consistent with the air interface standard, e.g., TIA/EIA/IS-2000, Wideband CDMA, etc., employed by the network in which the RBS 58 operates. These encoded signals serve as inputs to the RF transmitter resources 62, which amplify them to a level suitable for transmission via the antenna 64.

As noted earlier, EER represents one approach to RF signal amplification, and involves the separation of amplitude information from phase information. Thus, the RF transmitter resources may receive pairs of amplitude and phase modulation signals corresponding to desired transmit signal information. That is, transmit processing resources 60 might generate amplitude and phase information signals representing desired amplitude and phase modulations for a RF carrier signal that correspond to information for one or more mobile stations.

FIG. 4B illustrates use of the error amplifier circuit 10 for EER amplification within the RBS 58. More particularly, exemplary RF transmitter resources 62-1 include the EER circuit 40 of FIG. 3, or some variation of that basic circuit. In this manner, RF transmitter resources 62-1 might receive an amplitude modulation signal and a corresponding phase modulation signal from the transmit processing resources 60. The amplitude modulation signal would then drive the EER circuit 40, which, using the error amplifier circuit 10, generates a low-distortion, amplitude-modulated, voltage supply signal for PA 48. The PA 48 receives the phase modulation signal, and amplifies it based on deriving its operating power from the modulated supply signal from circuit 40. Thus, the RF_OUT signal from the PA 48 includes the desired phase and amplitude modulation information.

Of course, the RBS 58 might include a plurality of EER circuits 40 for generating multiple amplitude modulation signals corresponding to desired amplitude modulations for a plurality of RF carrier signals transmitted by the RBS 58. Further, the RBS 58 might include additional error amplifier circuits 10 apart from those included in EER circuits 40. That is, use of the error amplifier circuit 10 is not limited to EER circuit applications within RBS 58.

Indeed, it should be understood that the foregoing discussion and accompanying illustrations depict exemplary embodiments and applications of the error amplifier circuit 10, but in no way serve to limit its range of applications. Therefore, the present invention is limited only by the scope of the following claims, and the reasonable equivalents thereof.

What is claimed is:

1. An error amplifier circuit to reduce distortion in an amplified signal, the error amplifier circuit comprising:
   a first amplifier to generate a reference signal by amplifying an input signal from which the amplified signal is derived;
   an error sense element to generate an error signal based on a difference between a compensated amplified signal and the reference signal;
   a second amplifier to generate a feedback signal by amplifying the error signal; and
   an output transformer to generate the compensated amplified signal by combining the feedback signal with the amplified signal, such that the compensated amplified signal has less distortion than the amplified signal.

2. The error amplifier circuit of claim 1, wherein the error sense element comprises a resistive element coupling the reference signal to the compensated amplified signal, such that the error signal is generated across the resistive element.

3. The error amplifier circuit of claim 2, wherein the second amplifier comprises a differential amplifier circuit comprising differential inputs coupled across the resistive element, such that the second amplifier generates the feedback signal responsive to the error signal.

4. The error amplifier circuit of claim 1, wherein the error sense element comprises an error sense transformer.

5. The error amplifier circuit of claim 4, wherein the error sense transformer comprises:
   a first winding having a first end coupled to the first amplifier and a second end coupled to the output transformer, such that a differential error signal between the reference signal and the compensated amplified signal is developed across the first winding;
   a second winding generating the error signal responsive to the differential error signal developed in the first winding, and having a first end coupled to a signal ground and a second end coupled to the second amplifier, thereby providing the error signal to the second amplifier.

6. The error amplifier circuit of claim 5, wherein the error sense transformer has a turns ratio of the first winding to second winding in a range from about 1:4 to about 1:16.

7. The error amplifier circuit of claim 5, wherein the error sense transformer has a turns ratio of the first winding to second winding that is chosen to be about 1:4, such that the error signal has a signal gain of about four (4) with respect to the differential error signal.

8. The error amplifier circuit of claim 5, wherein a gain of the second amplifier is set to not less than about ten times a gain ratio calculated as a signal gain of the output transformer relative to the feedback signal and a signal gain of the error sense transformer relative to the error signal.

9. The error amplifier circuit of claim 4, wherein the input signal comprises a radio frequency signal, and wherein the error sense transformer comprises a high-frequency core material to avoid core saturation at radio frequencies in the MHz range.

10. The error amplifier circuit of claim 1, wherein the output transformer comprises:
    a first winding having a first end to receive the input signal, and a second end at which the compensated amplified signal is provided;
    a second winding having a first end coupled to a signal ground and a second end coupled to the second amplifier, such that the feedback signal is applied to the second winding.

11. The error amplifier circuit of claim 10, wherein a turns ratio of the first winding to the second winding of the output transformer is in the range from about 1:4 to about 1:16.

12. The error amplifier circuit of claim 10, wherein a turns ratio of the first winding to the second winding of the output transformer is chosen to increase a reflected load impedance at the second winding of a load coupled to the first winding.

13. The error amplifier circuit of claim 10, wherein the first winding of the output transformer comprises a high-current winding suitable for driving one or more Amps into an external load driven by the compensated amplified signal.

14. The error amplifier circuit of claim 10, wherein a turns ratio of the first winding to the second winding in the output transformer is about 1:10, such that a reflected load impedance at the second winding is about 100 times an actual load impedance of a load coupled to the first winding.

15. The error amplifier circuit of claim 1, wherein the output transformer transforms a load impedance of an external load supplied by the compensated amplified signal into a higher-impedance load suitable for driving at relatively lower currents via the feedback signal generated by the second amplifier.

16. An envelope elimination and restoration (EER) circuit for use in a radio frequency transmitter, the EER circuit comprising the error amplifier circuit of claim 1, and further comprising:
    a primary amplifier to generate the amplified signal by amplifying the input signal, and wherein the input signal is an amplitude modulation signal;
    a switching amplifier to generate a second amplified signal by amplifying the lower frequency components of the input signal;
    a summing node at which the second amplified signal and the compensated amplified signal are combined; and
    wherein the primary amplifier provides a majority of the higher frequency components of the compensated amplified signal and the switching amplifier provides a majority of the lower frequency components of the compensated amplified signal.

17. The EER circuit of claim 16, wherein at least some of the switching noise of the switching amplifier couples into the error signal via the error sense element such that the feedback signal generated by the second amplifier includes a switching noise compensation signal coupled into the amplified signal via the output transformer.

18. The EER circuit of claim 16, further comprising a radio frequency (RF) power amplifier, and wherein the RF power amplifier comprises a RF input to receive a phase modulation signal, a supply input to receive a supply voltage, and an output to provide a RF output signal based on amplifying the phase modulation signal, and wherein the supply input of the RF power amplifier is coupled to the summing node of the EER circuit.

19. A method of reducing distortion in an amplified signal generated by amplifying an input signal with a primary amplifier, the method comprising:

generating a reference signal by amplifying the input signal independently of the primary amplifier;

generating an error signal by sensing a difference between a compensated amplified signal and the reference signal;

amplifying the error signal to generate a feedback signal;

combining the feedback signal with the amplified signal from the primary amplifier to generate the compensated amplified signal.

20. The method of claim 19, further comprising using an error sense transformer to generate the error signal.

21. The method of claim 20, wherein using the error sense transformer to generate the error signal includes providing the reference signal to a first end of a first winding of the error sense transformer and providing the compensated amplified signal to a second end of the first winding to generate a differential error signal across the first winding.

22. The method of claim 21, wherein generating the error signal includes reflecting the differential error signal as a single-ended error signal into an input of an error amplifier used to amplify the error signal by coupling the input of error amplifier to a signal ground via a second winding of the error sense transformer.

23. The method of claim 22, further comprising setting a turns ratio of the first winding to second winding of the error sense transformer in the range from about 1:4 to about 1:16.

24. The method of claim 19, wherein combining the feedback signal with the amplified signal from the primary amplifier to generate the compensated amplified signal comprises coupling the feedback signal into the amplified signal via an output transformer.

25. The method of claim 24, wherein coupling the feedback signal into the amplified signal comprises:

coupling the amplified signal to an external load via a first winding of the output transformer;

coupling the feedback signal to a signal ground via a second winding of the output transformer; and wherein mutual inductance between the first and second windings reflects the feedback signal into the amplified signal with a desired signal gain to generate the compensated amplified signal.

26. The method of claim 25, further comprising setting a turns ratio of the first winding to second winding of the output transformer such that a reflected impedance of the external load seen by feedback signal at the second winding is greater than an actual impedance of the external load.

27. The method of claim 26, further comprising setting the turns ratio between the first and second windings of the output transformer in the range from about 1:4 to about 1:16.

28. A radio base station for use in a communication network, the radio base station including at least one error amplifier circuit for reducing distortion in amplified signals, said error amplifier circuit comprising:

a first amplifier to generate a reference signal by amplifying an input signal from which the amplified signal is derived;

an error sense element to generate an error signal based on a difference between a compensated amplified signal and the reference signal;

a second amplifier to generate a feedback signal by amplifying the error signal; and an output transformer to generate the compensated amplified signal responsive to the input signal by combining the feedback signal with the amplified signal, such that the compensated amplified signal has less distortion than the amplified signal.

29. The radio base station of claim 28, further comprising a radio frequency (RF) power amplifier including a RF signal input to receive a RF input signal and a supply voltage input coupled to an output of the second amplifier circuit to receive the compensated amplified signal as a supply voltage, and wherein the RF power amplifier generates a RF output signal by amplifying the RF input signal.

30. The radio base station of claim 29, wherein the error amplifier circuit and the RF power amplifier comprise at least a portion of an envelope-elimination-and-restoration (EER) circuit, and wherein the compensated amplified signal serving as the supply voltage for the RF power amplifier imparts desired amplitude modulation information to the RF output signal from the RF power amplifier.

31. The radio base station of claim 30, wherein the input signal to the error amplifier circuit comprises an amplitude modulation signal representing desired amplitude modulation information, and further wherein the RF signal input of the RF power amplifier is coupled to a phase modulation signal representing desired phase modulation information, such that the RF output signal includes desired amplitude and phase modulation information.

32. The radio base station of claim 31, further comprising transmit processing resources generating the amplitude and phase modulation signals based on desired transmit information.

33. The radio base station of claim 32, further comprising a transmit antenna, and wherein the RF output signal from the RF power amplifier is transmitted via the transmit antenna.

34. The radio base station of claim 28, wherein the error sense element comprises a resistive element coupling the reference signal to the compensated amplified signal, such that the error signal is generated across the resistive element.

35. The radio base station of claim 34, wherein the second amplifier of the error amplifier circuit comprises a differential amplifier circuit comprising differential inputs coupled across the resistive element, such that the second amplifier generates the feedback signal responsive to the error signal.

36. The radio base station of claim 28, wherein the error sense element of the error amplifier circuit comprises an error sense transformer.

37. The radio base station of claim 36, wherein the error sense transformer comprises:

a first winding having a first end coupled to the first amplifier and a second end coupled to the output transformer, such that a differential error signal between the reference signal and the compensated amplified signal is developed across the first winding;

a second winding generating the error signal responsive to the differential error signal developed in the first winding, and having a first end coupled to a signal ground and a second end coupled to the second amplifier, thereby providing the error signal to the second amplifier.

38. The radio base station of claim 37, wherein a turns ratio of the first winding to second winding of the error sense transformer is in the range from about 1:4 to about 1:16.

39. The radio base station of claim 38, wherein the turns ratio of the first winding to second winding of the error sense transformer is chosen to be about 1:4, such that the error signal has a signal gain of about four (4) with respect to the differential error signal.

40. The radio base station of claim 38, wherein a gain of the second amplifier is set to not less than about ten times a gain ratio calculated as a signal gain of the output transformer relative to the feedback signal and a signal gain of the error sense transformer relative to the error signal.

41. The radio base station of claim 28, wherein the output transformer comprises:
   a first winding having a first end to receive the input signal, and a second end at which the compensated amplified signal is provided;
   a second winding having a first end coupled to a signal ground and a second end coupled to the second amplifier, such that the feedback signal is applied to the second winding.

42. The radio base station of claim 41, wherein a turns ratio of the first winding to second winding of the output transformer is in the range from about 1:4 to about 1:16.

43. The radio base station of claim 41, wherein a turns ratio of the first winding to second winding of the output transformer is chosen to increase a reflected load impedance at the second winding of a load coupled to the first winding.

44. The radio base station of claim 41, wherein the first winding of the output transformer comprises a high-current winding suitable for driving one or more Amps into an external load driven by the compensated amplified signal.

* * * * *